(12) United States Patent
Kimura et al.

(10) Patent No.: US 10,707,396 B2
(45) Date of Patent: Jul. 7, 2020

(54) POWER GENERATION ELEMENT, POWER GENERATION MODULE, POWER GENERATION DEVICE, AND POWER GENERATION SYSTEM

(71) Applicant: Kabushiki Kaisha Toshiba, Minato-ku (JP)

(72) Inventors: Shigeya Kimura, Yokohama (JP); Koji Mizuguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 159 days.

(21) Appl. No.: 15/904,557

(22) Filed: Feb. 26, 2018

(65) Prior Publication Data
US 2018/0337317 A1  Nov. 22, 2018

(30) Foreign Application Priority Data

May 22, 2017 (JP) .................. 2017-101164

(51) Int. Cl.
| | | |
|---|---|---|
| H01L 35/02 | (2006.01) | |
| H02N 11/00 | (2006.01) | |
| H02N 3/00 | (2006.01) | |
| H01J 45/00 | (2006.01) | |
| H01L 37/00 | (2006.01) | |
| H01L 45/00 | (2006.01) | |

(52) U.S. Cl.
CPC ............. *H01L 35/02* (2013.01); *H01L 45/00* (2013.01); *H02N 3/00* (2013.01); *H02N 11/002* (2013.01); *H01L 37/00* (2013.01)

(58) Field of Classification Search
CPC ........ H01L 35/02; H01L 37/00; H02N 11/002
See application file for complete search history.

(56) References Cited

U.S. PATENT DOCUMENTS

| | | | |
|---|---|---|---|
| 2011/0139205 A1 | 6/2011 | Kimura et al. | |
| 2011/0148248 A1* | 6/2011 | Landa | H01J 45/00 310/306 |
| 2011/0210416 A1 | 9/2011 | Mantese | |
| 2013/0105693 A1 | 5/2013 | Noda | |

(Continued)

FOREIGN PATENT DOCUMENTS

| | | |
|---|---|---|
| CN | 102210034 A | 10/2011 |
| CN | 103090978 A | 5/2013 |

(Continued)

OTHER PUBLICATIONS

Jae-Hyung Lee et al. "Optimal emitter-collector gap for thermionic energy converters," Applied Physics Letters 100, 173904, DOI: 10.1063/1.4707379, 2012, pp. 5.

*Primary Examiner* — Lindsey A Bernier
(74) *Attorney, Agent, or Firm* — Oblon, McClelland, Maier & Neustadt, L.L.P.

(57) ABSTRACT

According to one embodiment, a power generation element includes a first conductive layer, a second conductive layer, a first member, and a second member. The first member includes a first crystal and is provided between the first conductive layer and the second conductive layer. The first crystal has a wurtzite structure. The second member is separated from the first member and is provided between the first member and the second conductive layer. A <000-1> direction of the first crystal has a component from the first member toward the second member.

23 Claims, 9 Drawing Sheets

(56) References Cited

U.S. PATENT DOCUMENTS

2016/0017786 A1   1/2016  Kimura et al.
2016/0285391 A1*  9/2016  Asanuma ................. H02N 1/08
2017/0077326 A1*  3/2017  Shibasaki ........... H01L 31/0322

FOREIGN PATENT DOCUMENTS

| | | |
|---|---|---|
| CN | 103192571 A | 7/2013 |
| CN | 103354240 A | 10/2013 |
| CN | 205195598 U | 4/2016 |
| EP | 0 959 507 A1 | 11/1999 |
| JP | 10-178218 A | 6/1998 |
| JP | 2002-329898 A | 11/2002 |
| JP | 2006-286417 A | 10/2006 |
| JP | 2007-288923 A | 11/2007 |
| JP | 2011-124412 | 6/2011 |
| JP | 2011-160552 A | 8/2011 |
| JP | 2013-229971 A | 11/2013 |
| JP | 2016-25208 | 2/2016 |
| JP | 5915336 | 5/2016 |
| JP | 2016-171246 | 9/2016 |
| JP | 2016-219710 A | 12/2016 |
| WO | WO-2014148371 A1 * | 9/2014 ............... H02N 1/08 |

\* cited by examiner

POWER GENERATION ELEMENT, POWER GENERATION MODULE, POWER GENERATION DEVICE, AND POWER GENERATION SYSTEM

CROSS-REFERENCE TO RELATED APPLICATIONS

This application is based upon and claims the benefit of priority from Japanese Patent Application No. 2017-101164, filed on May 22, 2017; the entire contents of which are incorporated herein by reference.

FIELD

Embodiments described herein relate generally to a power generation element, a power generation module, a power generation device, and a power generation system.

BACKGROUND

For example, there is a power generation element including an emitter electrode and a collector electrode, wherein heat from a heat source is applied to the emitter electrode, and the collector electrode captures thermal electrons from the emitter electrode. It is desirable to increase the efficiency of the power generation element.

DETAILED DESCRIPTION

Figure 1:
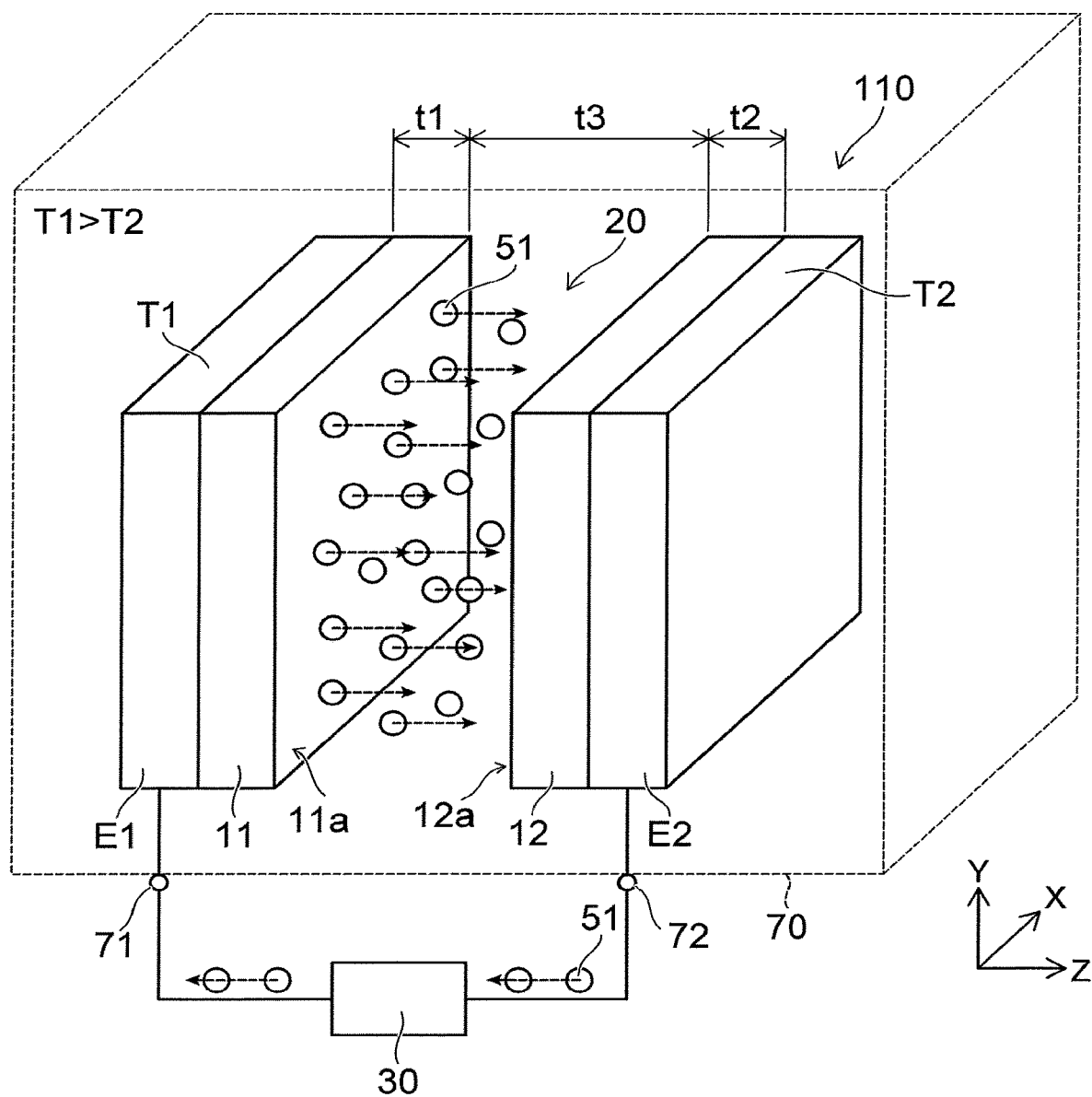
FIG. 1 is a schematic perspective view illustrating a power generation element according to a first embodiment.

According to one embodiment, a power generation element includes a first conductive layer, a second conductive layer, a first member, and a second member. The first member includes a first crystal and is provided between the first conductive layer and the second conductive layer. The first crystal has a wurtzite structure. The second member is separated from the first member and is provided between the first member and the second conductive layer. A <000-1> direction of the first crystal has a component from the first member toward the second member.

According to another embodiment, a power generation element includes a first conductive layer, a second conductive layer, a first member, and a second member. The first member is provided between the first conductive layer and the second conductive layer. The second member is separated from the first member and is provided between the first member and the second conductive layer. An orientation from negative to positive of a polarization of the first member is from the first member toward the second member.

According to another embodiment, a power generation module includes one of a plurality of the power generation elements described above.

According to another embodiment, a power generation device includes a plurality of the power generation modules described above.

According to another embodiment, a power generation system includes the power generation device described above and a drive device. The drive device causes the power generation device to follow a movement of the sun.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic perspective view illustrating a power generation element according to a first embodiment.

As shown in FIG. 1, the power generation element 110 according to the first embodiment includes a first conductive layer E1, a second conductive layer E2, a first member 11, and a second member 12.

The first member 11 is provided between the first conductive layer E1 and the second conductive layer E2. The first member 11 includes, for example, a first crystal having a wurtzite structure. The second member 12 is provided between the first member 11 and the second conductive layer E2. The second member 12 is separated from the first member 11. For example, the second member 12 includes a second crystal having a wurtzite structure. The first crystal and the second crystal are, for example, AlN.

A gap 20 is provided between the first member 11 and the second member 12. The gap 20 is in a reduced-pressure state. For example, a container 70 is provided. For example, the first member 11 and the second member 12 are provided in the interior of the container 70. The interior of the container 70 is caused to be in a reduced-pressure state. Thereby, the gap 20 is in a reduced-pressure state.

For example, the first member 11 is electrically connected to the first conductive layer E1. The second member 12 is electrically connected to the second conductive layer E2. A first terminal 71 and a second terminal 72 are provided. The first terminal 71 is electrically connected to the first conductive layer E1. The second terminal 72 is electrically connected to the second conductive layer E2. A load 30 is electrically connectable between the first terminal 71 and the second terminal 72.

For example, the temperature of the first conductive layer E1 (and the first member 11) is taken as a first temperature T1. The temperature of the second conductive layer E2 (and the second member 12) is taken as a second temperature T2. For example, the temperature (the first temperature T1) of the first member 11 is caused to be higher than the temperature (the second temperature T2) of the second member 12. For example, the first conductive layer E1 (and the first member 11) are connected to a heat source, etc. Thereby, the first temperature T1 becomes higher than the second temperature T2. Thereby, electrons 51 are emitted from the first member 11. The electrons 51 are, for example, thermal electrons. The electrons 51 travel toward the second member 12. The electrons 51 reach the second member 12.

The electrons 51 that reach the second member 12 flow into the load 30 via the second conductive layer E2 and the second terminal 72. The flow of the electrons 51 corresponds to a current.

Thus, in the power generation element 110, the temperature difference between the first conductive layer E1 (and the first member 11) and the second conductive layer E2 (and the second member 12) can be converted into a current.

The first conductive layer E1 (and the first member 11) is, for example, an emitter. The second conductive layer E2 (and the second member 12) is, for example, a collector.

A direction from the first member 11 toward the second member 12 is taken as a Z-axis direction. The Z-axis direction corresponds to the direction from the first conductive layer E1 toward the second conductive layer E2. One direction perpendicular to the Z-axis direction is taken as an X-axis direction. A direction perpendicular to the Z-axis direction and the X-axis direction is taken as a Y-axis direction.

In the example, the first member 11 and the second member 12 have film configurations spreading along the X-Y plane. In the embodiment, the configurations of the first member 11 and the second member 12 are arbitrary.

At least one of the first crystal or the second crystal includes, for example, nitrogen and at least one selected from the group consisting of B, Al, In, and Ga. At least one of the first crystal or the second crystal may include at least one selected from the group consisting of ZnO and ZnMgO.

In the case where the first member 11 is a semiconductor, a thickness t1 of the first member 11 is, for example, not less than 100 nm and not more than 1000 nm. In the case where the first member 11 is insulative, the thickness t1 of the first member 11 is, for example, 5 nm or less. In the case where the first member 11 is insulative, it is favorable for the thickness t1 to be not less than 1 nm and not more than 2 nm.

In the case where the second member 12 is a semiconductor, a thickness t2 of the second member 12 is, for example, not less than 100 nm and not more than 1000 nm. In the case where the second member 12 is insulative, the thickness t2 of the second member 12 is, for example, 5 nm or less. In the case where the second member 12 is insulative, it is favorable for the thickness t2 to be not less than 1 nm and not more than 2 nm. The thickness t1 and the thickness t2 are lengths along the Z-axis direction.

A distance t3 between the first member 11 and the second member 12 is not less than 0.1 μm and not more than 50 μm. It is more favorable for the distance t3 to be 10 μm or less. The distance t3 is the length along the Z-axis direction. The distance t3 corresponds to the distance of the gap 20.

In the embodiment, the <000-1> direction of the first crystal of the first member 11 has a component from the first member 11 toward the second member 12. For example, the first member 11 has a first surface 11a. The first surface 11a opposes the second member 12. The first surface 11a is, for example, the (000-1) plane. The first surface 11a may be a semi-polar plane.

In the embodiment, for example, the <000-1> direction of the second crystal of the second member 12 has a component from the second member 12 toward the first member 11. For example, the second member 12 has a second surface 12a. The second surface 12a opposes the first member 11. The second surface 12a is, for example, the (000-1) plane. The second surface 12a may be a semi-polar plane.

It was found that a high power generation efficiency is obtained by the first member 11 (and the second member 12) having polarities such as those recited above.

An example of simulation results of the characteristics of the power generation element will now be described.

FIG. 2A to FIG. 2E are schematic cross-sectional views illustrating the power generation element.

These drawings show the configuration that is used in the simulation. In the simulation, the first conductive layer E1 and the second conductive layer E2 are Mo layers. The first member 11 and the second member 12 are AlN. The thickness of the AlN is 2000 nm. The distance of the gap 20 (the length along the Z-axis direction, i.e., the distance t3) is 1 μm.

Figure 2A:
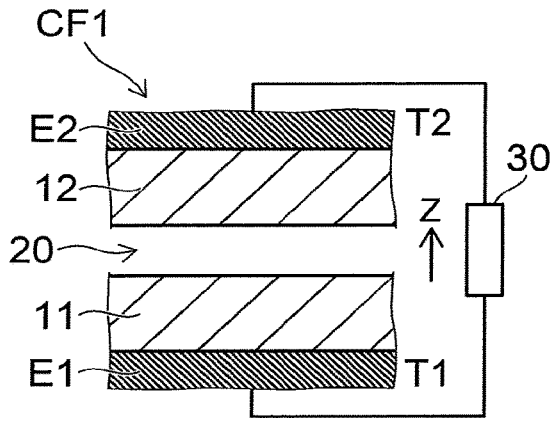
FIG. 2A to FIG. 2E are schematic cross-sectional views illustrating the power generation element.

In a first configuration CF1 shown in FIG. 2A, the first member 11 and the second member 12 do not have polarizations (spontaneous polarizations). For example, the first configuration CF1 corresponds to the case where the first member 11 and the second member 12 are amorphous.

Figure 2B:
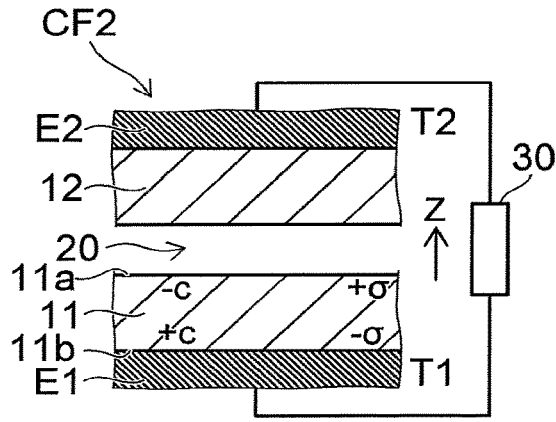

In a second configuration CF2 shown in FIG. 2B, the first member 11 has a polarization. The first member 11 has the first surface 11a on the second member 12 side, and a surface 11b on the first conductive layer E1 side. The polarization is positive (+σ) at the first surface 11a. The polarization is negative (−σ) at the surface 11b. The first surface 11a is the −c plane (the (000-1) plane). The surface 11b is the +c plane (the (0001) plane). In the second configuration CF2, the second member 12 does not have a polarization.

Figure 2C:
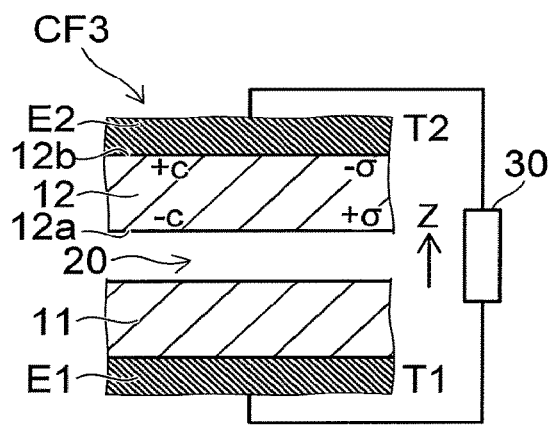

In a third configuration CF3 shown in FIG. 2C, the second member 12 has a polarization. The second member 12 has the second surface 12a on the first member 11 side, and a surface 12b on the second conductive layer E2 side. The polarization is positive (+σ) at the second surface 12a. The polarization is negative (−σ) at the surface 12b. The second surface 12a is the −c plane (the (000-1) plane). The surface 12b is the +c plane (the (0001) plane). In the third configuration CF3, the first member 11 does not have a polarization.

Figure 2D:
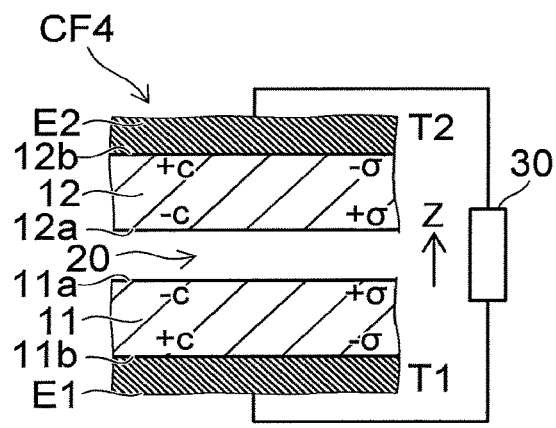

In a fourth configuration CF4 shown in FIG. 2D, the first member 11 and the second member 12 have polarizations. The orientations of the polarizations are mutually-reversed. The polarization is positive (+σ) at the first surface 11a. The first surface 11a is the −c plane (the (000-1) plane). The polarization is positive (+σ) at the second surface 12a. The second surface 12a is the −c plane (the (000-1) plane).

Figure 2E:
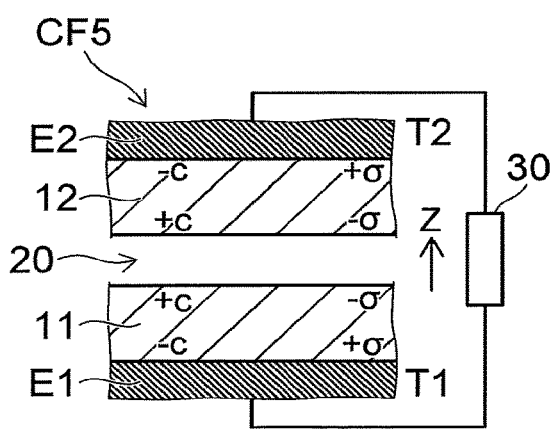

In a fifth configuration CF5 shown in FIG. 2E as well, the first member 11 and the second member 12 have polarizations. The orientations of the polarizations of the fifth configuration CF5 are the reverse of the orientations of the polarizations of the fourth configuration CF4.

FIG. 3A to FIG. 3D are schematic views illustrating characteristics of the power generation element.

These figures are energy band diagrams of the first to fifth configurations CF1 to CF5. For these configurations, the first temperature T1 and the second temperature T2 are 300 K (Kelvin). In these drawings, the horizontal axis is a position pZ (μm) along the Z-axis direction. The vertical axis is an energy Eg (electron volt (eV)).

Figure 3A:
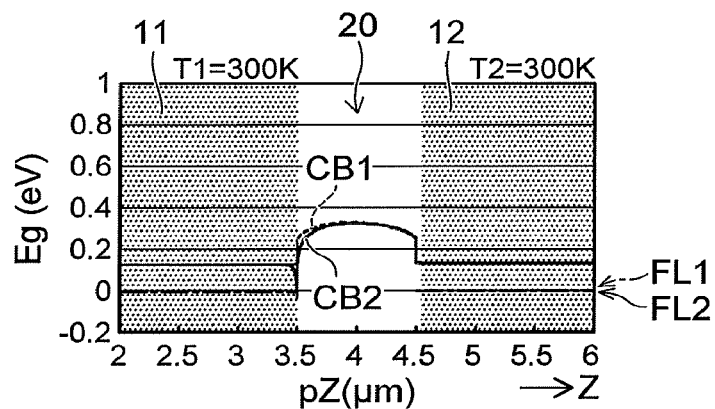
FIG. 3A to FIG. 3D are schematic views illustrating characteristics of the power generation element.

A Fermi level FL1 of the first configuration CF1, a conduction band level CB1 of the first configuration CF1, a Fermi level FL2 of the second configuration CF2, and a conduction band level CB2 of the second configuration CF2 are shown in FIG. 3A. It can be seen from FIG. 3A that compared to the first configuration CF1, the energy Eg at the surface of the first member 11 (the surface between the first member 11 and the gap 20) is different for the second configuration CF2.

Figure 3B:
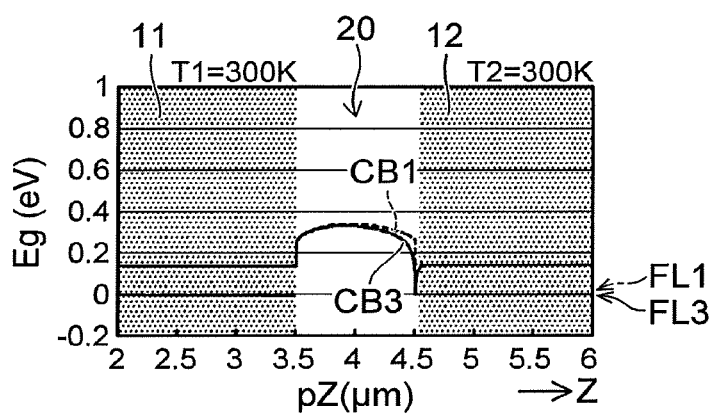

In FIG. 3B, a Fermi level FL3 of the third configuration CF3 and a conduction band level CB3 of the third configuration CF3 are shown in addition to the Fermi level FL1 of the first configuration CF1 and the conduction band level CB1 of the first configuration CF1. It can be seen from FIG. 3B that the energy Eg at the surface of the second member 12 (the surface between the second member 12 and the gap 20) of the third configuration CF3 is different from the energy Eg of the first configuration CF1.

Figure 3C:
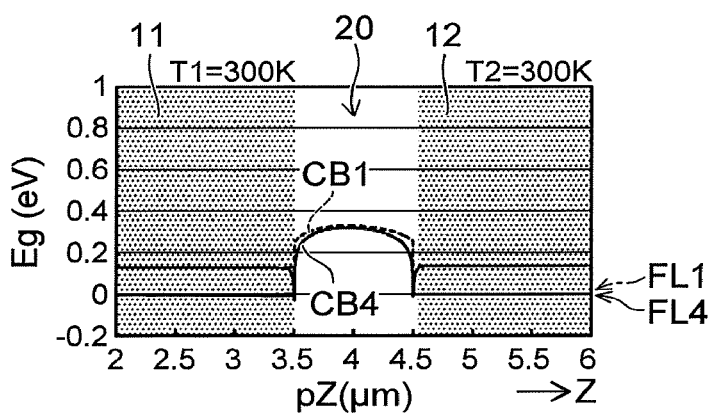

In FIG. 3C, a Fermi level FL4 of the fourth configuration CF4 and a conduction band level CB4 of the fourth configuration CF4 are shown in addition to the Fermi level FL1 of the first configuration CF1 and the conduction band level CB1 of the first configuration CF1. It can be seen from FIG. 3C that the energy Eg of the fourth configuration CF4 is different from the energy Eg of the first configuration CF1 at the surface of the first member 11 and the surface of the second member 12.

Figure 3D:
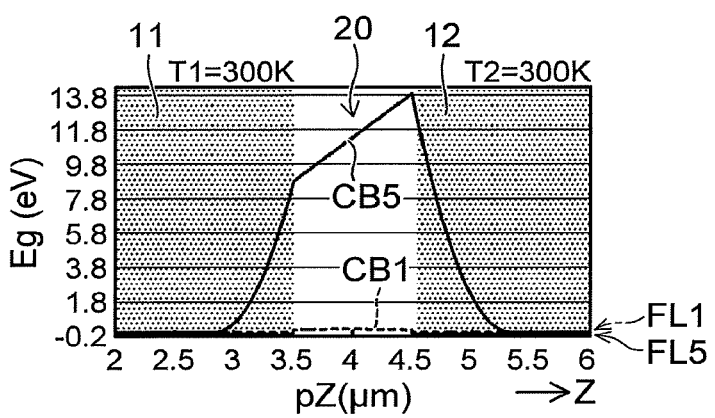

A Fermi level FL5 of the fifth configuration CF5 and a conduction band level CB5 of the fifth configuration CF5 are shown in addition to the Fermi level FL1 of the first configuration CF1 and the conduction band level CB1 of the first configuration CF1 in FIG. 3D. It can be seen from FIG. 3D that compared to the first to fourth configurations CF1 to CF4, the energy Eg is markedly large for the fifth configuration CF5.

It can be seen from FIG. 3A to FIG. 3C that in the case where the surface of the first member 11 or the second member 12 is the –c plane (the (000-1) plane), the energy Eg of the conduction band level is low at these surfaces.

On the other hand, as shown in FIG. 3D, the energy Eg of the conduction band level is markedly high in the case where the surfaces of the first member 11 and the second member 12 are the +c plane (the (0001) plane). Therefore, it is considered that the thermal electrons (the electrons 51) are not emitted easily for the fifth configuration CF5.

An example of characteristics when the first temperature T1 is set to be higher than the second temperature T2 will now be described.

Figure 4A:
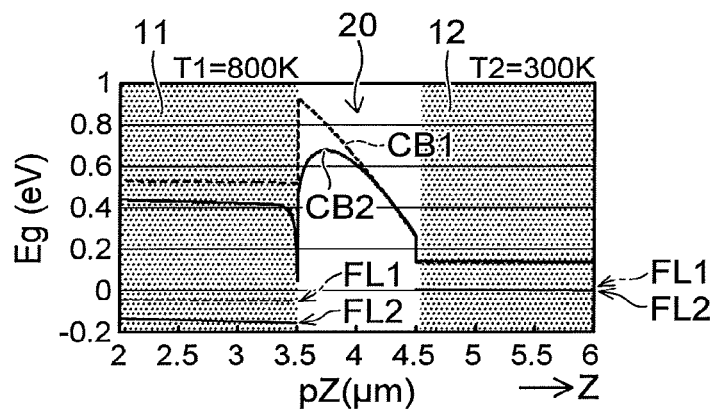
FIG. 4A to FIG. 4C are schematic views illustrating the characteristics of the power generation element.
Figure 4B:
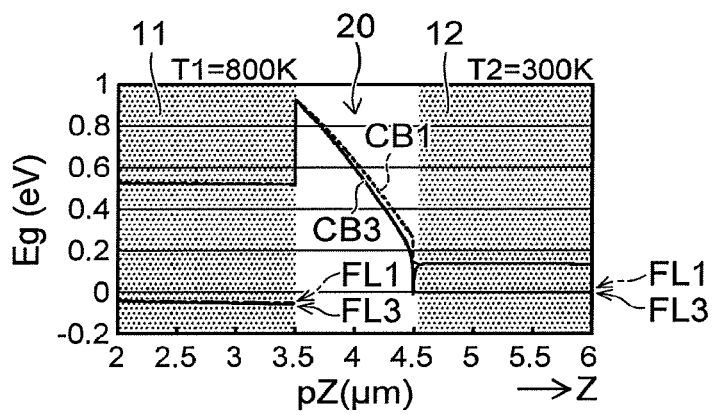
Figure 4C:
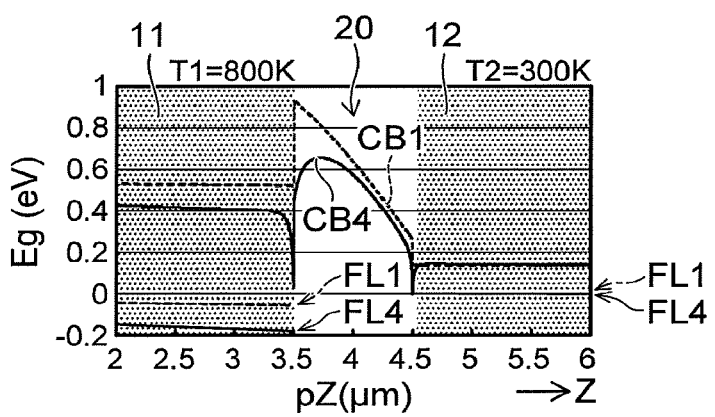

FIG. 4A to FIG. 4C are schematic views illustrating the characteristics of the power generation element.

These figures are energy band diagrams of the first to fourth configurations CF1 to CF4. For these configurations, the first temperature T1 is 800 K; and the second temperature T2 is 300 K. A simulation of the characteristics of the fifth configuration CF5 was attempted; but the calculated values did not converge; and the characteristics of the fifth configuration CF5 were not obtained. In these drawings, the horizontal axis is the position pZ. The vertical axis is the energy Eg.

As shown in FIG. 4A, the conduction band level CB2 of the second configuration CF2 is lower than the conduction band level CB1 of the first configuration CF1 at the surface of the first member 11 (the surface between the first member 11 and the gap 20).

As shown in FIG. 4B, the conduction band level CB3 of the third configuration CF3 is lower than the conduction band level CB1 of the first configuration CF1 at the surface of the second member 12 (the second member 12 and the gap 20).

As shown in FIG. 4C, the conduction band level CB4 of the fourth configuration CF4 is lower than the conduction band level CB1 of the first configuration CF1 at the surface of the first member 11 and the surface of the second member 12.

Thus, the energy Eg at the surface is low due to at least one of the first member 11 or the second member 12 having the polarization of the polarity recited above.

Figure 5:
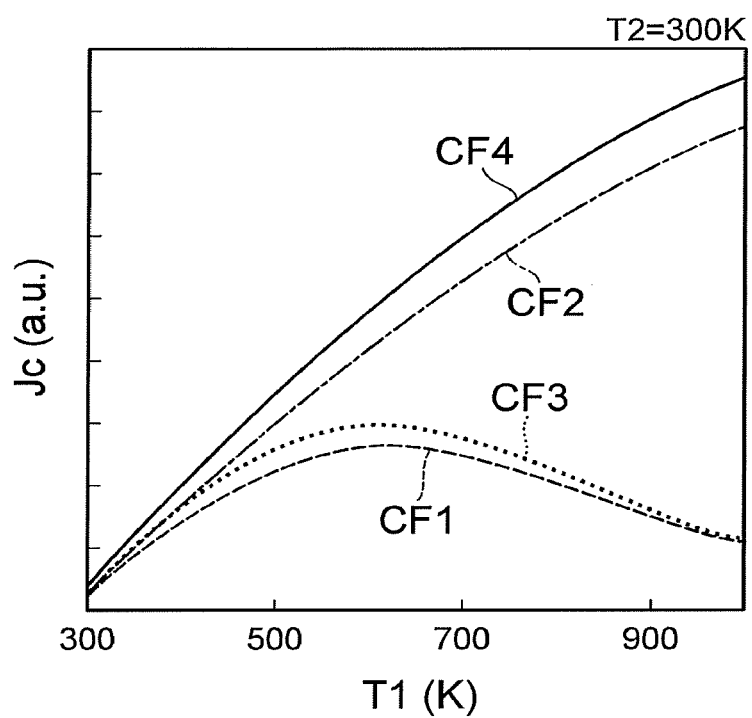
FIG. 5 is a graph illustrating a characteristic of the power generation element.

FIG. 5 is a graph illustrating a characteristic of the power generation element.

FIG. 5 shows simulation results of the power generation characteristics of the first to fourth configurations CF1 to CF4. The horizontal axis of FIG. 5 is the first temperature T1 (Kelvin (K)). The vertical axis is a current density Jc (arbitrary units). In the example, the second temperature T2 is 300 K.

As shown in FIG. 5, the current density Jc of the third configuration CF3 is higher than the current density Jc of the first configuration CF1. The current density Jc of the second configuration CF2 is higher than the current density Jc of the third configuration CF3. The current density Jc of the fourth configuration CF4 is higher than the current density Jc of the second configuration CF2.

Thus, a high current density Jc is obtained by at least one of the first member 11 or the second member 12 having the polarization of the polarity recited above. In particular, a particularly high current density Jc (the second configuration CF2 and the fourth configuration CF4) is obtained by the first member 11 of which the temperature is caused to be relatively high having the polarization of the polarity recited above. For example, a particularly high current density Jc (the fourth configuration CF4) is obtained by both the first member 11 and the second member 12 having the polarizations of the polarities recited above. The high current density Jc corresponds to a high efficiency. A high efficiency is obtained by at least one of the first member 11 or the second member 12 having the polarization of the polarity recited above.

For example, it is considered that such a high current density Jc is caused by the characteristics of the conduction bands described in reference to FIG. 4A to FIG. 4C. The characteristics of the conduction bands are the characteristics of the barrier height at the surfaces of the first member 11 and the second member 12. It is considered that the barrier height has a relationship with the electron affinity.

In the power generation element, it is considered that the electron affinities of the materials of the first member 11 and the second member 12 themselves have a relationship with the power generation efficiency. An example of the power generation efficiency of the first configuration CF1 and the fourth configuration CF4 when changing the electron affinity will now be described.

Figure 6A:
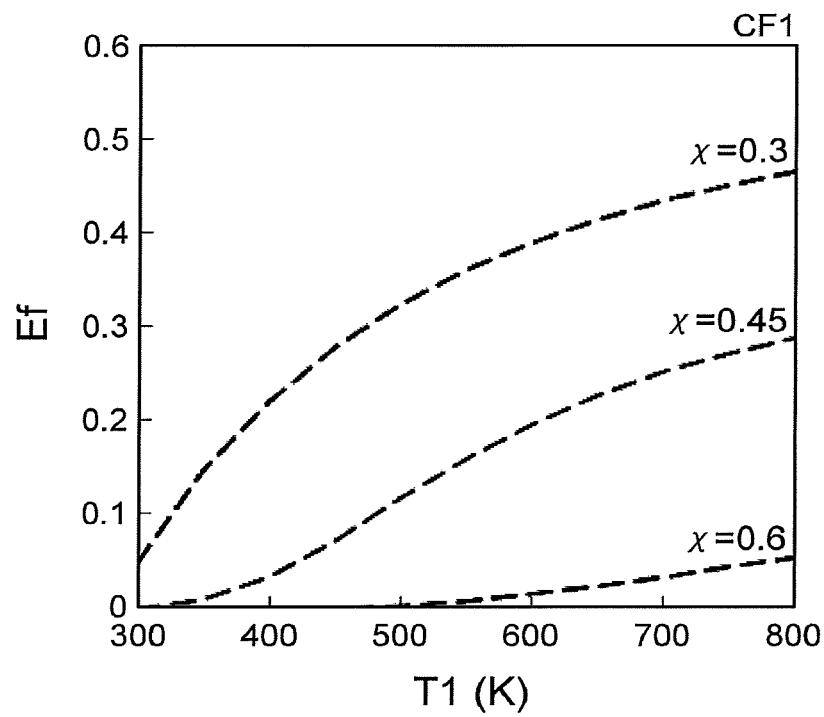
FIG. 6A and FIG. 6B are graphs illustrating characteristics of the power generation element.
Figure 6B:
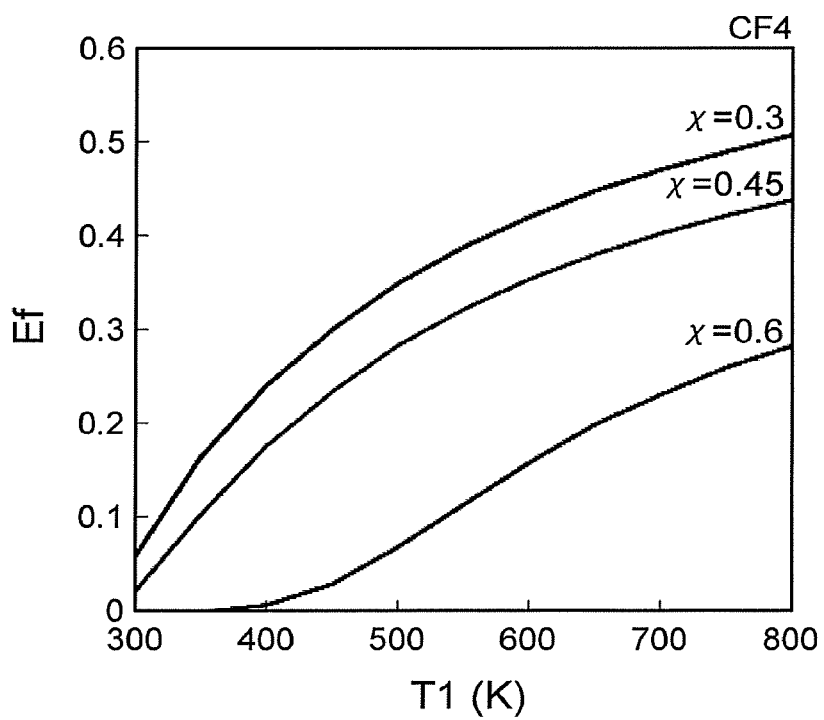

FIG. 6A and FIG. 6B are graphs illustrating characteristics of the power generation element.

FIG. 6A corresponds to a characteristic of the first configuration CF1. FIG. 6B corresponds to a characteristic of the fourth configuration CF4. In these figures, the horizontal axis is the first temperature T1. The vertical axis is a power generation efficiency Ef (arbitrary units). In the simulation of these figures, the second temperature T2 is 300 K. In the simulation, electron affinities $\chi$ of the first member 11 and the second member 12 are modified to 0.3, 0.45, or 0.6.

As shown in FIG. 6A and FIG. 6B, the power generation efficiency Ef of the fourth configuration CF4 is higher than the power generation efficiency Ef of the first configuration CF1 for the same first temperature T1 when the electron affinity $\chi$ is 0.3, 0.45, or 0.6. In particular, the improvement effect of the power generation efficiency Ef due to the fourth configuration CF4 is large when the electron affinity $\chi$ is high.

In the embodiment as described above, at least one of the first member 11 or the second member 12 includes a crystal having a wurtzite structure. At least one of the first member 11 or the second member 12 includes, for example, a nitride semiconductor. Or, at least one of the first member 11 or the second member 12 includes at least one selected from the group consisting of ZnO and ZnMgO.

In the embodiment, at least one of the first member 11 or the second member 12 may include an insulative material. For example, at least one of the first member 11 or the second member 12 may include at least one selected from the group consisting of $BaTiO_3$, $PbTiO_3$, $Pb(Zr_x, Ti_{1-x})O_3$, $KNbO_3$, $LiNbO_3$, $LiTaO_3$, $Na_xWO_3$, $Zn_2O_3$, $Ba_2NaNb_5O_5$, $Pb_2KNb_5O_{15}$, and $Li_2B_4O_7$. $Pb(Zr_x, Ti_{1-x})O_3$ is PZT (lead zirconate titanate).

In such a case, for example, the orientation from negative to positive of the polarization of the first member 11 is from the first member 11 toward the second member 12. For example, the orientation from negative to positive of the polarization of the second member 12 is from the second member 12 toward the first member 11. Even in such a case, a high efficiency is obtained.

In the case where the first member 11 and the second member 12 include an insulative material, the thicknesses of the first member 11 and the second member 12 are thin. Thereby, the current flows easily. For example, the thickness t1 of the first member 11 (the length along the direction from the first member 11 toward the second member 12) is 5 nm or less. The thickness t1 may be not less than 1 nm and not more than 2 nm. For example, the thickness t2 (the length along the direction from the second member 12 toward the first member 11) of the second member 12 is 5 nm or less. The thickness t2 may be not less than 1 nm and not more than 2 nm. At least one of the first member 11 or the second member 12 may have an island configuration or a mesh configuration.

In the embodiment as described above, at least one of the first member 11 or the second member 12 may include a semiconductor crystal. The semiconductor crystal includes, for example, nitrogen and at least one selected from the group consisting of B, Al, In, and Ga. Or, at least one of the first member 11 or the second member 12 includes at least one selected from the group consisting of ZnO and ZnMgO. Even in such a case, the orientation from negative to positive of the polarization of the first member 11 is from the first member 11 toward the second member 12. For example, the orientation from negative to positive of the polarization of the second member 12 is from the second member 12 toward the first member 11. A high efficiency is obtained.

Second Embodiment

A second embodiment is related to a method for manufacturing a power generation element. For example, the power generation element 110 according to the first embodiment can be manufactured by the manufacturing method.

FIG. 7A to FIG. 7E are schematic cross-sectional views illustrating the method for manufacturing the power generation element according to the second embodiment.

Figure 7A:
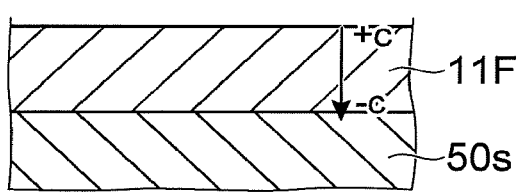
FIG. 7A to FIG. 7E are schematic cross-sectional views illustrating the method for manufacturing the power generation element according to the second embodiment.

As shown in FIG. 7A, a first film 11F is formed on a base body 50s. The first film 11F is used to form at least one of the first member 11 or the second member 12. For example, a Si substrate, an $Al_2O_3$ substrate, a SiC substrate, or the like is used as the base body 50s. For example, crystal growth of the first film 11F is performed by metal organic chemical vapor deposition (MOCVD), etc. The first film 11F may be formed by crystal growth using molecular beam epitaxy (MBE), etc. The first film 11F is, for example, a crystal of a nitride semiconductor. The surface (the upper surface) of the first film 11F is the +c plane. The lower surface (the surface on the base body 50s side) of the first film 11F is the −c plane.

Figure 7B:
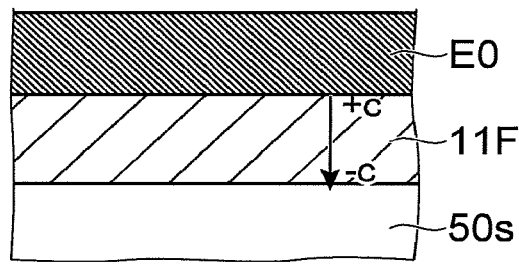

As shown in FIG. 7B, a conductive layer E0 is formed on the first film 11F. The conductive layer E0 is at least one of the first conductive layer E1 or the second conductive layer E2. The conductive layer E0 includes, for example, at least one selected from the group consisting of Mo and W. For example, the conductive layer E0 is formed by vapor deposition. For example, the conductive layer E0 may be Mo or W having a wafer configuration. In such a case, for example, the conductive layer E0 is bonded to the first film 11F.

Figure 7C:
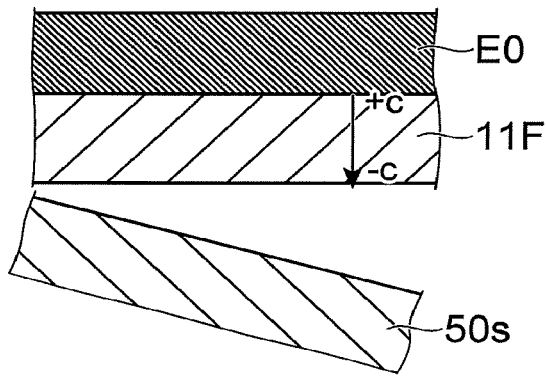

The base body 50s is removed as shown in FIG. 7C.

Figure 7D:
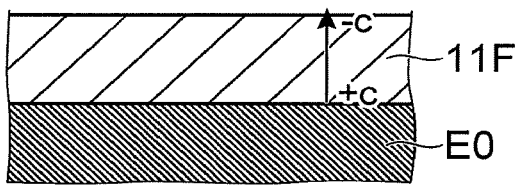

As shown in FIG. 7D, the surface of the first film 11F is the −c plane. Such a structure body including the conductive layer E0 and the first film 11F is multiply prepared. In one of the multiple structure bodies, the conductive layer E0 is used as the first conductive layer E1; and the first film 11F is used as the first member 11. In another one of the multiple structure bodies, the conductive layer E0 is used as the second conductive layer E2; and the first film 11F is used as the second member 12.

Figure 7E:
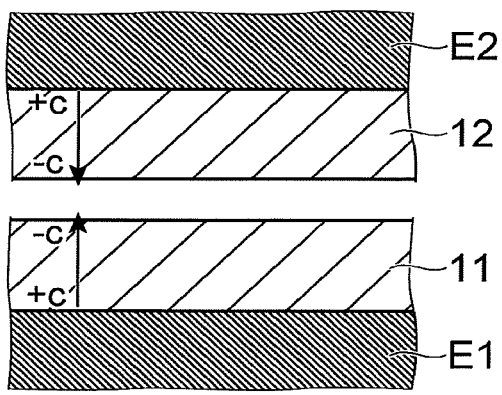

As shown in FIG. 7E, the first member 11 and the second member 12 are assembled so that the first member 11 and the second member 12 oppose each other. Thereby, the power generation element 110 according to the embodiment is made.

Figure 8A:
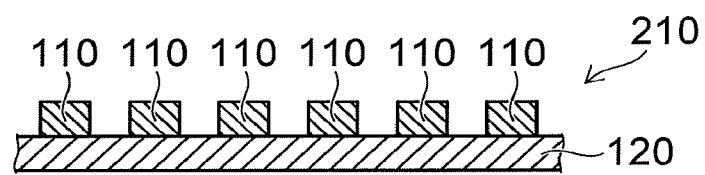
FIG. 8A and FIG. 8B are schematic cross-sectional views showing a power generation module and a power generation device according to the embodiment.
Figure 8B:
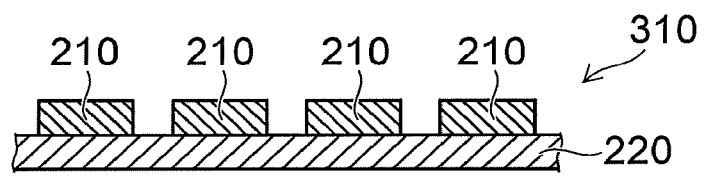

FIG. 8A and FIG. 8B are schematic cross-sectional views showing a power generation module and a power generation device according to the embodiment.

As shown in FIG. 8A, the power generation module 210 according to the embodiment includes the power generation element 110 according to the first embodiment. In the example, multiple power generation elements 110 are arranged on a substrate 120.

As shown in FIG. 8B, the power generation device 310 according to the embodiment includes the power generation module 210 recited above. Multiple power generation modules 210 may be provided. In the example, the multiple power generation modules 210 are arranged on a substrate 220.

Figure 9A:
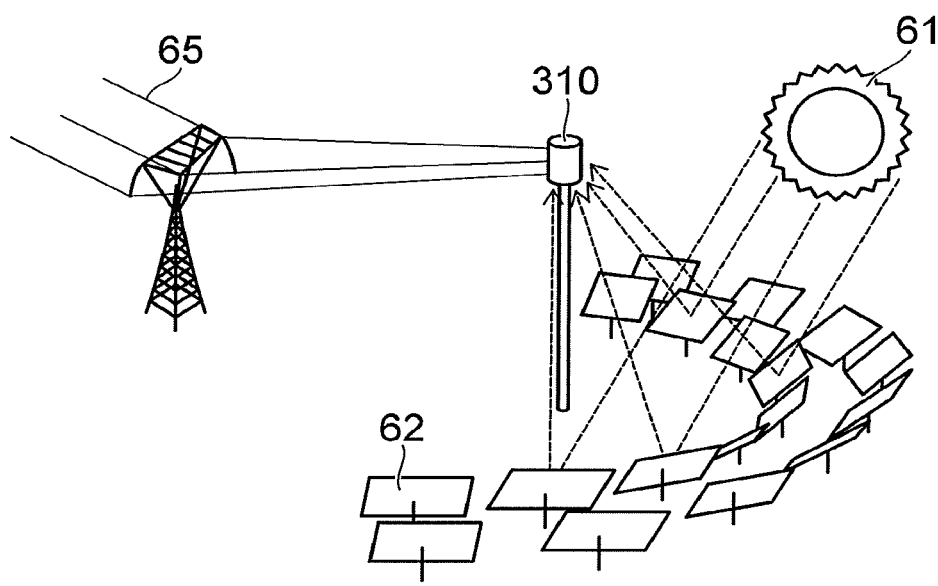
FIG. 9A and FIG. 9B are schematic views showing a power generation device and a power generation system according to the embodiment.
Figure 9B:
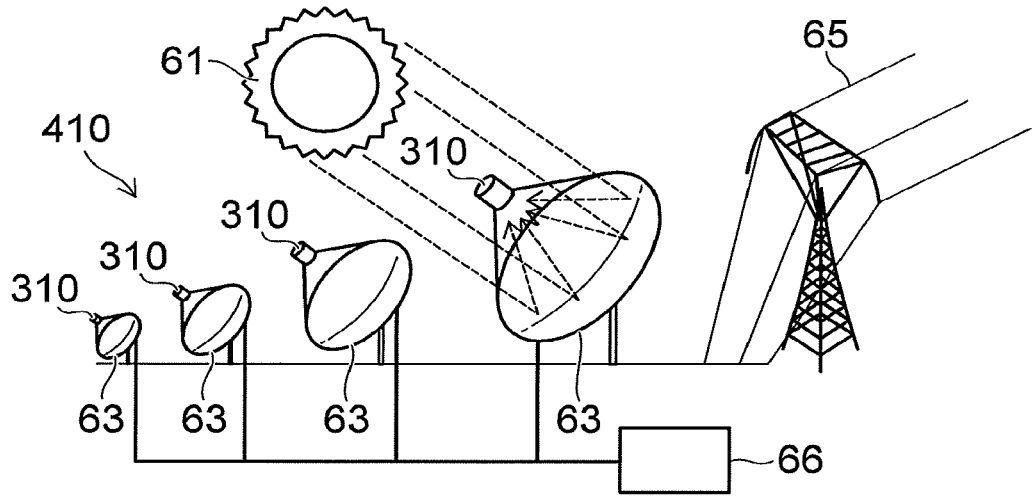

FIG. 9A and FIG. 9B are schematic views showing a power generation device and a power generation system according to the embodiment.

As shown in FIG. 9A and FIG. 9B, the power generation device 310 according to the embodiment (i.e., the power generation element 110 or the power generation module 210 according to the first embodiment) is applicable to solar thermal power generation.

As shown in FIG. 8A, for example, the light from the sun 61 is reflected by a heliostat 62 and is incident on the power generation device 310 (the power generation element 110 or the power generation module 210). The light causes the first temperature T1 of the first member 11 and the first conductive layer E1 to increase. The first temperature T1 becomes higher than the second temperature T2. Heat is changed into current. The current is transmitted by a power line 65, etc.

As shown in FIG. 8B, for example, the light from the sun 61 is concentrated by a concentrating mirror 63 and is incident on the power generation device 310 (the power generation element 110 or the power generation module 210). The heat due to the light is changed into current. The current is transmitted by the power line 65, etc.

For example, the power generation system 410 includes the power generation device 310. In the example, multiple power generation devices 310 are provided. In the example, the power generation system 410 includes the power generation devices 310 and a drive device 66. The drive device 66 causes the power generation devices 310 to follow the movement of the sun 61. By following the movement of the sun 61, efficient power generation can be performed.

Highly efficient power generation can be performed by using the power generation element 110 according to the embodiment.

The embodiments may include the following configurations (technological proposals).

Configuration 1

A power generation element, comprising:

a first conductive layer;

a second conductive layer;

a first member including a first crystal and being provided between the first conductive layer and the second conductive layer, the first crystal having a wurtzite structure; and a second member separated from the first member and provided between the first member and the second conductive layer, the <000-1> direction of the first crystal having a component from the first member toward the second member.

Configuration 2

The power generation element according to Configuration 1, wherein the first member has a first surface opposing the second member, and the first surface is the (000-1) plane.

Configuration 3

The power generation element according to Configuration 1 or 2, wherein the second member includes a second crystal having a wurtzite structure, and the <000-1> direction of the second crystal has a component from the second member toward the first member.

Configuration 4

The power generation element according to Configuration 3, wherein the second member has a second surface opposing the first member, and the second surface is the (000-1) plane.

Configuration 5

The power generation element according to Configuration 3 or 4, wherein the second crystal includes nitrogen and at least one selected from the group consisting of B, Al, In, and Ga.

Configuration 6

The power generation element according to Configuration 3 or 4, wherein the second crystal includes at least one selected from the group consisting of ZnO and ZnMgO.

Configuration 7

The power generation element according to any one of Configurations 1 to 6, wherein the first crystal includes nitrogen and at least one selected from the group consisting of B, Al, In, and Ga.

Configuration 8

The power generation element according to any one of Configurations 1 to 6, wherein the first crystal includes at least one selected from the group consisting of ZnO and ZnMgO.

Configuration 9

A power generation element, comprising:

a first conductive layer;

a second conductive layer;

a first member provided between the first conductive layer and the second conductive layer; and a second member separated from the first member and provided between the first member and the second conductive layer, an orientation from negative to positive of a polarization of the first member being from the first member toward the second member.

Configuration 10

The power generation element according to Configuration 9, wherein an orientation from negative to positive of a polarization of the second member is from the second member toward the first member.

Configuration 11

The power generation element according to Configuration 10, wherein the second member includes at least one selected from the group consisting of $BaTiO_3$, $PbTiO_3$, $Pb(Zr_x, Ti_{1-x})O_3$, $KNbO_3$, $LiNbO_3$, $LiTaO_3$, $Na_xWO_3$, $Zn_2O_3$, $Ba_2NaNb_5O_5$, $Pb_2KNb_5O_{15}$, and $Li_2B_4O_7$.

Configuration 12

The power generation element according to Configuration 11, wherein a thickness of the second member along a direction from the second member toward the first member is 5 nm or less.

Configuration 13

The power generation element according to Configuration 11, wherein the second member has an island configuration or a mesh configuration.

Configuration 14

The power generation element according to Configuration 10, wherein the second member includes a second crystal, and the second crystal includes nitrogen and at least one selected from the group consisting of B, Al, In, and Ga.

Configuration 15

The power generation element according to any one of Configurations 9 to 14, wherein the first member includes at least one selected from the group consisting of $BaTiO_3$, $PbTiO_3$, $Pb(Zr_x, Ti_{1-x})O_3$, $KNbO_3$, $LiNbO_3$, $LiTaO_3$, $Na_xWO_3$, $Zn_2O_3$, $Ba_2NaNb_5O_5$, $Pb_2KNb_5O_{15}$, and $Li_2B_4O_7$.

Configuration 16

The power generation element according to Configuration 15, wherein a thickness of the first member along a direction from the first member toward the second member is 5 nm or less.

Configuration 17

The power generation element according to Configuration 15, wherein the first member has an island configuration or a mesh configuration.

Configuration 18

The power generation element according to Configuration 9, wherein the first member includes a first crystal, and the first crystal includes nitrogen and at least one selected from the group consisting of B, Al, In, and Ga.

Configuration 19

The power generation element according to any one of Configurations 1 to 18, further comprising:

a first terminal electrically connected to the first conductive layer; and
a second terminal electrically connected to the second conductive layer,
a load being electrically connectable between the first terminal and the second terminal.

Configuration 20

The power generation element according to any one of Configurations 1 to 19, wherein
when a temperature of the first member is higher than a temperature of the second member,
electrons are emitted from the first member, and
the electrons reach the second member.

Configuration 21

A power generation module, comprising a plurality of the power generation elements according to any one of Configurations 1 to 20.

Configuration 22

A power generation device, comprising a plurality of the power generation modules according to Configuration 21.

Configuration 23

A power generation system, comprising:
the power generation device according to Configuration 22; and
a drive device,
the drive device causing the power generation device to follow a movement of the sun.

According to the embodiments, a power generation element, a power generation module, a power generation device, and a power generation system can be provided in which the efficiency can be increased.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in power generation elements such as conductive layers, members, terminals, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all power generation elements, power generation modules, power generation devices, and power generation systems practicable by an appropriate design modification by one skilled in the art based on the power generation elements, the power generation modules, the power generation devices, and the power generation systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A power generation element, comprising:
a first conductive layer;
a second conductive layer;
a first member including a first crystal and being provided between the first conductive layer and the second conductive layer, the first crystal having a wurtzite structure; and
a second member separated from the first member and provided between the first member and the second conductive layer, a gap being provided between the first member and the second member,
a <000-1> direction of the first crystal having a component from the first member toward the second member,
wherein the second member includes a second crystal having a wurtzite structure,
a <000-1> direction of the second crystal has a component from the second member toward the first member, and
a thickness of the first member along a direction from the first member toward the second member is 5 nm or less.

2. The element according to claim 1, wherein
the first member has a first surface opposing the second member, and
the first surface is a (000-1) plane.

3. The element according to claim 1, wherein
the second member has a second surface opposing the first member, and
the second surface is a (000-1) plane.

4. The element according to claim 1, wherein the second crystal includes nitrogen and at least one selected from the group consisting of B, Al, In, and Ga.

5. The element according to claim 1, wherein the second crystal includes at least one selected from the group consisting of ZnO and ZnMgO.

6. The element according to claim 1, wherein the first crystal includes nitrogen and at least one selected from the group consisting of B, Al, In, and Ga.

7. The element according to claim 1, wherein the first crystal includes at least one selected from the group consisting of ZnO and ZnMgO.

8. A power generation element, comprising:
a first conductive layer;
a second conductive layer;
a first member provided between the first conductive layer and the second conductive layer; and
a second member separated from the first member and provided between the first member and the second conductive layer, a gap being provided between the first member and the second member,
the first member including a first surface and a third surface, the first surface being provided between the third surface and the second member, a polarization being positive at the first surface, and
a polarization being negative at the third surface,
wherein the second member includes a second surface and a fourth surface, the second surface is provided between the fourth surface and the first member,
a polarization is positive at the second surface, and
a polarization is negative at the fourth surface.

9. The element according to claim 8, wherein the second member includes at least one selected from the group consisting of $BaTiO_3$, $PbTiO_3$, $Pb(Zr_x, Ti_{1-x})O_3$, $KNbO_3$, $LiNbO_3$, $LiTaO_3$, $Na_xWO_3$, $ZnO$, $Ba_2NaNb_5O_5$, $Pb_2KNb_5O_{15}$, and $Li_2B_4O_7$.

10. The element according to claim 8, wherein
the second member includes a second crystal, and
the second crystal includes nitrogen and at least one selected from the group consisting of B, Al, In, and Ga.

11. The element according to claim 8, wherein the first member includes at least one selected from the group consisting of $BaTiO_3$, $PbTiO_3$, $Pb(Zr_x, Ti_{1-x})O_3$, $KNbO_3$, $LiNbO_3$, $LiTaO_3$, $NaWO_3$, $ZnO$, $Ba_2NaNb_5O_5$, $Pb_2KNb_5O_{15}$, and $Li_2B_4O_7$.

12. The element according to claim 11, wherein a thickness of the first member along a direction from the first member toward the second member is 5 nm or less.

13. The element according to claim 8, wherein
the first member includes a first crystal, and
the first crystal includes nitrogen and at least one selected from the group consisting of B, Al, In, and Ga.

14. The element according to claim 1, further comprising:
a first terminal electrically connected to the first conductive layer; and
a second terminal electrically connected to the second conductive layer,
a load being electrically connectable between the first terminal and the second terminal.

15. The element according to claim 1, wherein
when a temperature of the first member is higher than a temperature of the second member,
electrons are emitted from the first member, and
the electrons reach the second member.

16. A power generation module, comprising a plurality of the power generation elements according to claim 1.

17. A power generation device, comprising a plurality of the power generation modules according to claim 16.

18. A power generation system, comprising:
the power generation device according to claim 17; and
a drive device,
the drive device causing the power generation device to follow a movement of the sun.

19. The element according to claim 8, further comprising:
a first terminal electrically connected to the first conductive layer; and
a second terminal electrically connected to the second conductive layer,
a load being electrically connectable between the first terminal and the second terminal.

20. The element according to claim 8, wherein when a temperature of the first member is higher than a temperature of the second member,
electrons are emitted from the first member, and
the electrons reach the second member.

21. A power generation module, comprising a plurality of the power generation elements according to claim 8.

22. A power generation device, comprising a plurality of the power generation modules according to claim 21.

23. A power generation system, comprising:
the power generation device according to claim 22; and
a drive device causing the power generation device to follow a movement of the sun.

* * * * *